United States Patent
Wang (10) Patent No.: US 7,103,288 B2
(45) Date of Patent: Sep. 5, 2006

(54) DYNAMIC CONTROL OF PHOTODIODE BIAS VOLTAGE

(75) Inventor: Wenlu Wang, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 50 days.

(21) Appl. No.: 10/801,711

(22) Filed: Mar. 17, 2004

(65) Prior Publication Data

US 2005/0205759 A1   Sep. 22, 2005

(51) Int. Cl.
*H04B 10/06* (2006.01)

(52) U.S. Cl. .................... 398/212; 250/214 R (58) Field of Classification Search ............. 398/213, 398/154, 212, 26, 27; 250/214 R
See application file for complete search history.

(56) References Cited

U.S. PATENT DOCUMENTS

| 5,953,690 A | 9/1999 | Lemon et al. |
| 6,222,660 B1 * | 4/2001 | Traa ............................ 398/213 |
| 6,313,459 B1 | 11/2001 | Hoffe et al. |

* cited by examiner

*Primary Examiner*—Thanh X. Luu
*Assistant Examiner*—Tony Ko
(74) *Attorney, Agent, or Firm*—Kent Daniels; Ogilvy Renault LLP (57) ABSTRACT

Accordingly, an aspect of the present invention provides a method of dynamically controlling a bias point of a photodiode of an optical receiver. According to the present invention a performance parameter indicative of an eye opening of an optical signal received by the optical receiver is detected. A bias voltage of the photodiode s dynamically adjusted so as to optimize a value of the detected performance parameter.

14 Claims, 7 Drawing Sheets

DYNAMIC CONTROL OF PHOTODIODE BIAS VOLTAGE

CROSS-REFERENCE TO RELATED APPLICATIONS

This is the first application filed for the present invention.

MICROFICHE APPENDIX

Not Applicable.

TECHNICAL FIELD

The present invention relates to receivers utilized in optical communication systems, and in particular to methods and systems for dynamically controlling the bias voltage of a photodiode.

BACKGROUND OF THE INVENTION

Figure 1:
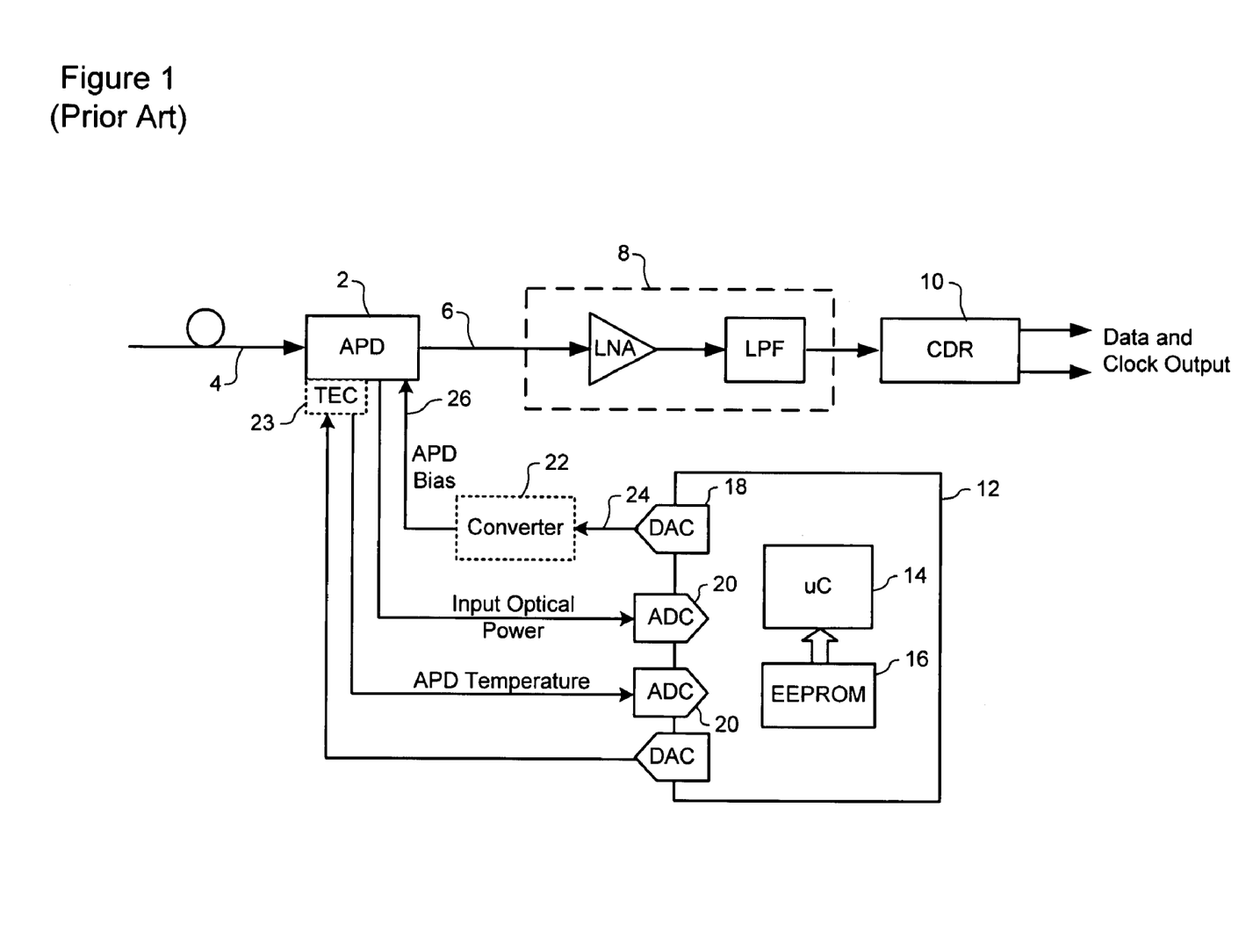
FIG. 1 is a block diagram schematically illustrating a conventional APD receiver.

Optical receivers used in communications systems generally comprise a photo-detector 2 for converting an optical signal 4 into an electrical signal 6 (See FIG. 1a). The electrical signal 6 output by the photodetector 2 is supplied to a linear channel 8 that may consist of a high gain amplifier and a low pass filter, and a Clock and Data Recovery (CDR) circuit 10.

The most extensively used photo-detectors in fiber optical systems are the P-Intrinsic-N (PIN) photodiode and the avalanche photodiode (APD). Optical receivers that use an APD normally provide higher sensitivity than that use PIN photodiode, since APDs have internal gain from the optical-to-electrical conversion process.

The performance of an APD is typically characterised by various performance parameters such as its gain, noise and bandwidth. These parameters vary with operating conditions (primarily temperature and optical input power) and are also subject to random manufacturing variations. As a result, each APD is unique, and exhibits a uniquely different response to variations in the input optical power, reverse bias voltage and temperature.

For example, when an APD is operated below its reverse breakdown voltage, an increase in the reverse bias voltage results in amplification. This is the region of normal APD operation. However at a reverse bias voltage equal to the breakdown voltage, dark currents increase exponentially, causing the receiver to be saturated with noise and possibly damaging or destroying the APD. Therefore the reverse bias voltage is normally set at a specified number of volts below the breakdown voltage specified by the manufacturer. However since each APD is unique, the breakdown voltage of each APD is different, and thus a different reverse bias voltage must be found for each APD.

As a result, careful control of the reverse bias voltage is required to maintain acceptable APD performance. This control function is typically provided by an APD bias controller 12 which comprises a micro-controller 14, a memory 16 (such as an EEPROM), one or more digital-to-analog converters (DACS) 18, and one or more analog-to-digital (ADCs) 20. A voltage converter 22 may be inserted between the controller 12 and the APD 2 to convert the DAC 18 output voltage 24 to the appropriate bias voltage 26 needed to drive the APD 2. A Thermal Electric Cooler (TEC) 23 may also be used to control the temperature of the APD 2, and thereby mitigate APD performance variations due to temperature fluctuations. Characteristic data for the APD 2 is stored in the memory 16, and used by the micro-controller 14 to determine the appropriate bias voltage. Various techniques are known for accomplishing this.

For example, U.S. Pat. No. 5,953,690, which issued to Lemon et al. on Sep. 14, 1999 teaches an intelligent fiberoptic receiver. During calibration procedures for the receiver, a thermal chamber is used to enable characterization of the APD (and its supporting control and monitoring circuits) over a defined operating temperature range. Characteristic data and/or curves defining these operational control and monitoring functions, over the range of operating conditions (e.g. temperature, input optical power etc.), are stored in non-volatile memory such as EEPROM. During operation, an embedded microcontroller detects current operating conditions of the APD, and uses this information to access the stored data for controlling the bias voltage.

U.S. Pat. No. 6,313,459, which issued to Hoffe et al. on Nov. 6, 2001, teaches an operational algorithm, and calibration process, for an APD receiver which takes into account an APD behavioural model. In-situ optical and electrical measurements of the APD are performed to determine key constants for use in the model.

U.S. Pat. No. 6,222,660, which issued to Traa on Apr. 24, 2001, teaches an adaptive power supply for an avalanche photodiode (APD). In cases where an optical input signal is not present, the adaptive power supply applies a swept voltage to the APD while monitoring the photodiode current. When breakdown occurs, the voltage is noted and the bias voltage from the adaptive power supply is set at a specified offset below the breakdown voltage. In cases where a source of optical digital data signal is present, it is coupled to the input of the APD via a programmable optical attenuator. The electrical digital signal output from the APD is input to a bit error rate counter, the output of which is monitored. For different input optical power levels, the APD bias voltage is swept by the adaptive power supply, so as to determine a constant optical power level curve over which the bit error rate is virtually zero. This is repeated for a plurality of optical power levels, the resulting family of curves defining a region within which the bit error rate is virtually zero. During operation, the adaptive power supply is set to a value that falls within the "virtually zero" bit error rate region for the expected optical power level input.

All of these approaches suffer a limitation in that extensive measurements are required in order to characterize the APD. These measurements must necessarily be conducted separately for each APD, can be time consuming, and cannot be conducted when the receiver is receiving "live" optical signal traffic. This also means that updating the characteristic data to compensate for age-related drift of component parameters, for example, may be difficult and/or expensive to implement. Furthermore, during operation, the bias voltage is controlled based on local parameters (i.e. optical power input, APD temperature etc.) and the stored characteristic data in an effort to optimize performance of the APD. However, this functionality may not succeed in optimizing performance of the receiver as a whole.

Accordingly, cost effective dynamic control the bias voltage of a photodide remains highly desirable.

SUMMARY OF THE INVENTION

An object of the present invention is to provide methods and apparatus enabling cost effective dynamic control of photodiode bias voltage.

Accordingly, an aspect of the present invention provides a method of dynamically controlling a bias point of a photodiode of an optical receiver. According to the present invention a performance parameter indicative of an eye opening of an optical signal received by the optical receiver is detected. A bias voltage of the photodiode is dynamically adjusted so as to optimize a value of the detected performance parameter.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

The present invention provides a cost effective system for dynamically controlling the bias voltage applied to a photodetector of an optical receiver. In the embodiments described below, the photodetector is an avalanche photodetector (APD) of the type well known in the art. However, the skilled artisan will appreciate that the present invention can equally be used to control the bias point of any other photodetector, such as a PIN diode. Thus, for the purposes of the present application, references to avalanche photodetectors should be understood to also refer to any other type of voltage (or current) biased photodetector elements including, but not limited to PIN diodes.

In general, the present invention provides a feedback bias control loop which operates to dynamically adjust the bias voltage so as to optimize operation of the optical receiver as a whole. In this respect, receiver optimization implies that the receiver eye quality has been maximized. Thus, the present invention dynamically optimizes the receiver eye quality by dynamically adjusting the APD gain (and therefore its total receiver transfer function) through adjusting the APD bias voltage. By optimizing overall receiver operation rather than "local" APD performance, the present invention automatically compensates variations in the APD operating conditions, such as temperature and input optical power. An embodiment of the present invention is described below with reference to FIGS. 2–7.

Figure 2:
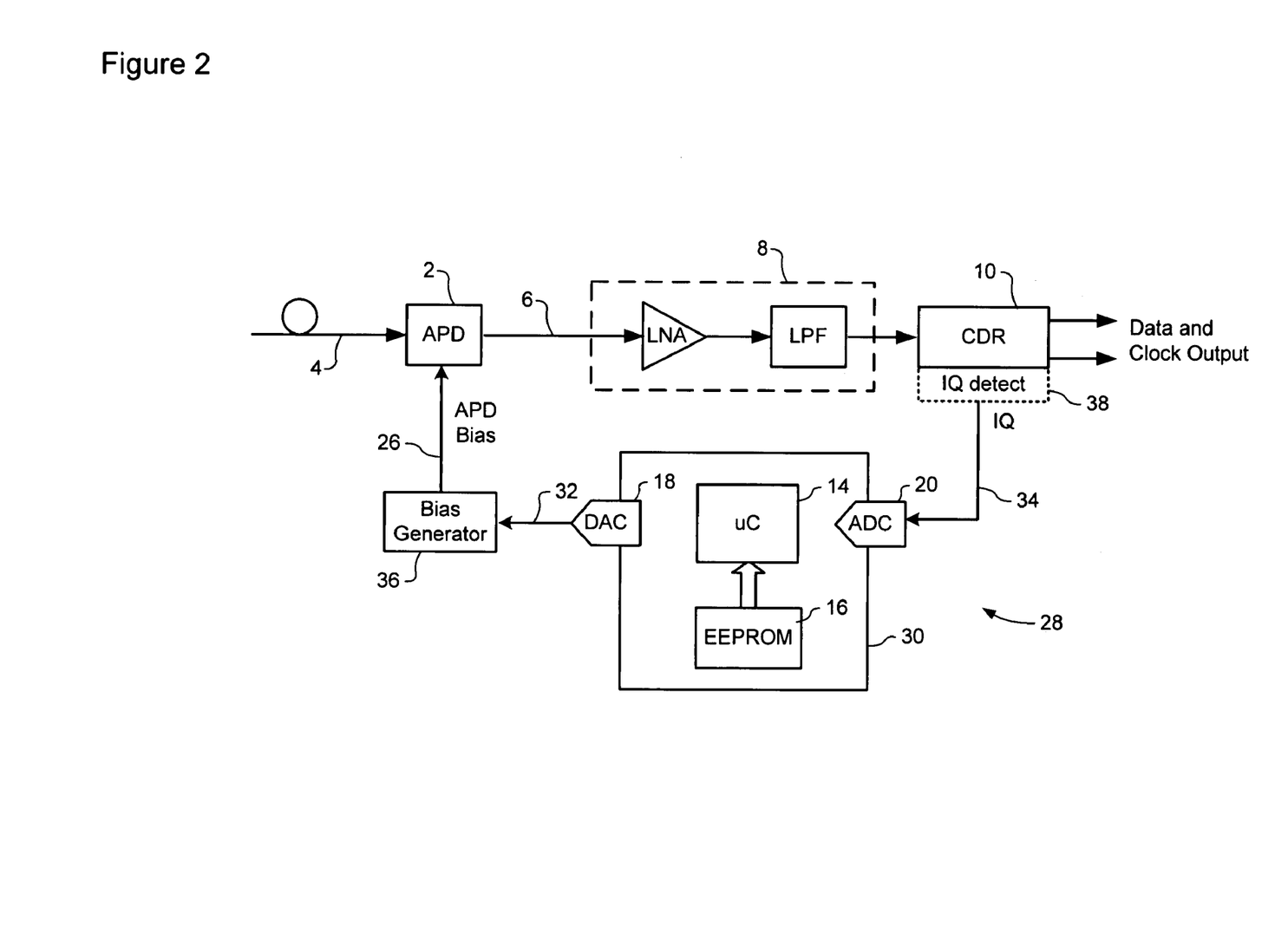
FIG. 2 is a block diagram schematically illustrating an APD receiver incorporating a dynamic bias control loop in accordance with an embodiment of the present invention.

As shown in FIG. 2, a dynamic control system of the present invention comprises a feedback loop 28 having a bias controller 30 which determines an optimum bias voltage set point 32 based on an Eye Quality (IQ) parameter 34 generated by the Clock and Data Recovery (CDR) circuit 10. A bias signal generator 36 receives the bias voltage set point 34 from the bias controller 30 and outputs a corresponding APD bias signal 26.

The IQ parameter 34 may be provided as any signal that is indicative of the eye quality, such as, for example, the eye opening ratio; bit error rate; or optical signal-to-noise ratio (OSNR) etc. Many commercially available CDR circuits are designed to generate such a parameter as an output signal, typically in the form of an analog voltage. Otherwise, an IQ detection circuit 38 can be provided to monitor operation of the CDR circuit 10 and generate the IQ parameter 34. Such detection circuits are known in the art, and thus will not be described in greater detail herein.

The bias controller 30 includes an analog-to-digital converter (ADC) 20 for sampling the IQ parameter 34, a micro-controller 14 for determining the optimum bias set point in accordance with a bias control algorithm described in detail below; and a digital-to-analog converter (DAC) 18 for outputting the bias set point from the bias controller 30. The DAC output is supplied to the bias signal generator 36 which outputs the APD bias signal 26 corresponding to the bias set point 32 determined by the micro-controller 14.

Figure 3:
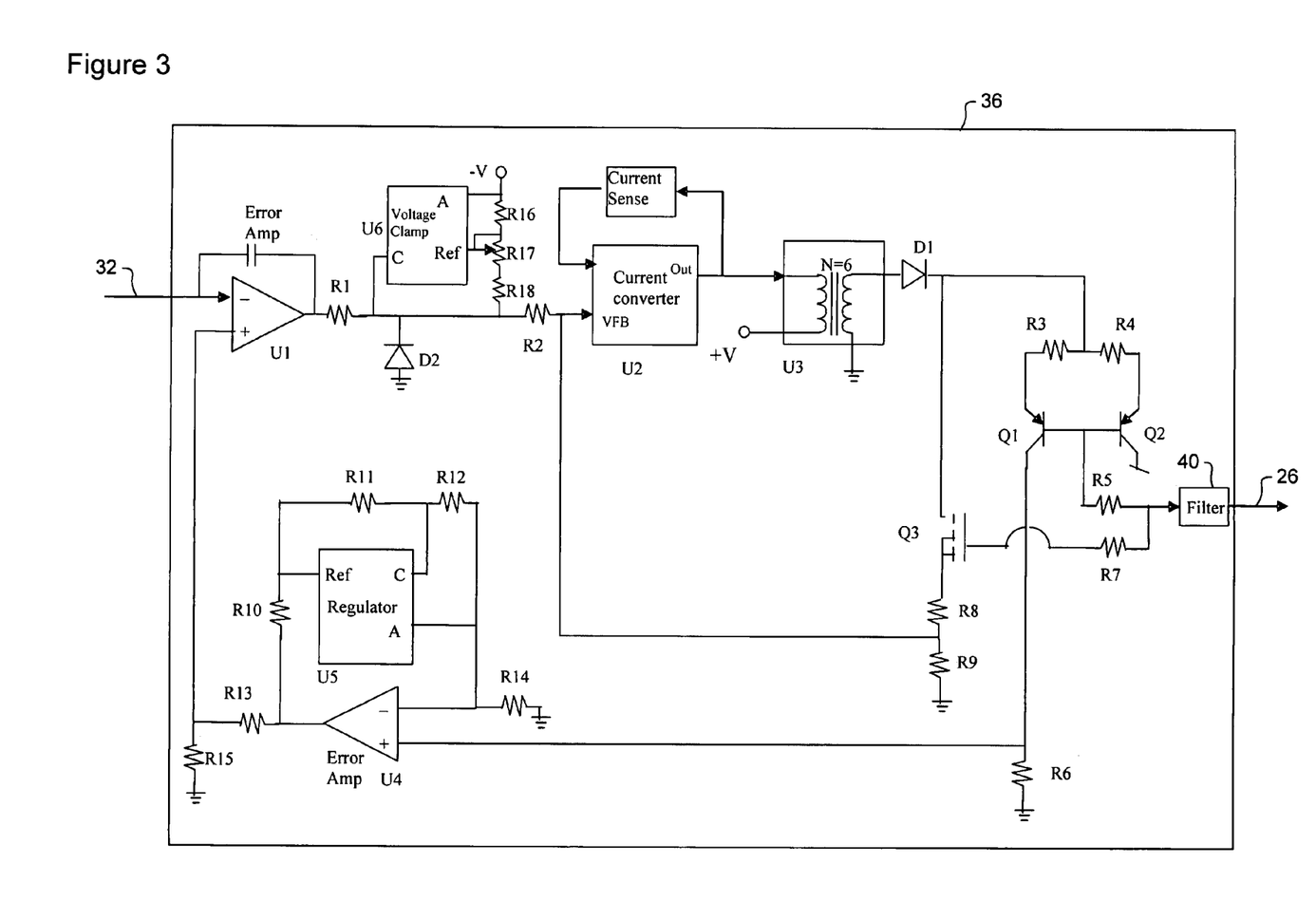
FIG. 3 is a block diagram schematically illustrating a bias voltage generator usable in the embodiment of FIG. 2.
Figure 4:
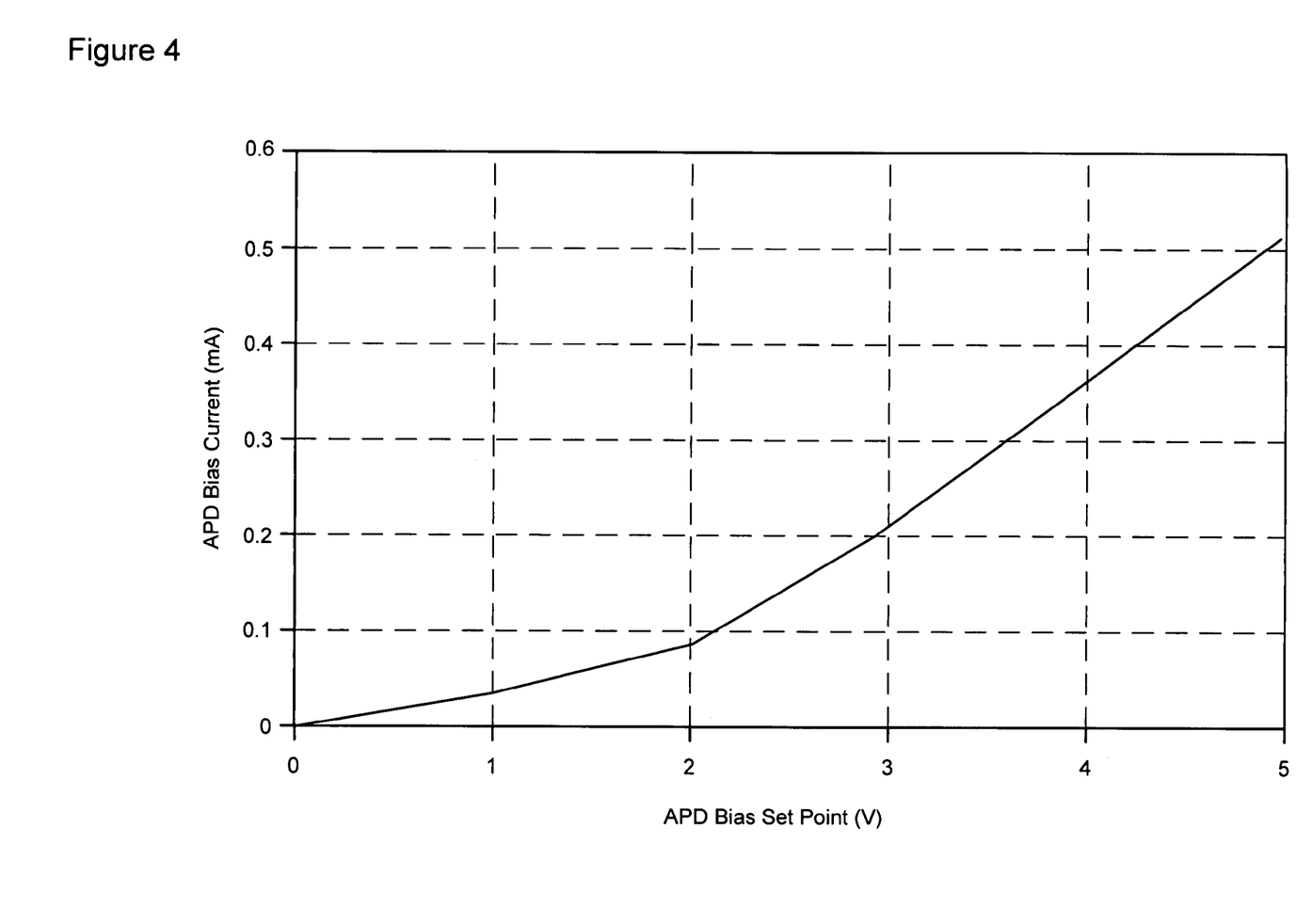
FIG. 4 is a chart showing a piecewise linear relationship between APD bias current and bias DAC output voltage, obtained using in the generator of FIG. 3.

FIG. 3 shows an example bias signal generator circuit 36 usable in the present invention. In general, the bias signal generator circuit 36 accepts an analog voltage (e.g. 0–5 volts) from a DAC 18 of the controller 30 and generates a corresponding bias current through the APD 2. The relationship between the DAC output voltage 32 and the APD bias current 26 output by the signal generator 36 is preferably piecewise linear, as shown in FIG. 4, to provide improved resolution at small APD currents.

As shown in FIG. 3, the APD bias current 26 is delivered to the APD 2 through a current mirror transistor pair Q1, Q2 from a fly-back current converter U2 and a transformer U3 which generates the high voltage required to force the desired current through the APD 2.

The main current path through the APD 2 is through resistor R4 and transistor Q2. A secondary current path is via resistor R3, transistor Q1, and resistor R6 to ground. Since R3 has about 20 times the resistance of R4, the current through this path will be about 1/20th of the APD current. The voltage across R6 (110 k Ohms) is about 5.5 mV for each 1 uA of APD current. This voltage is applied to the non-inverting input of the op amp U4, which acts together with U5 to produce a piecewise linear transfer function. The output from U5 is taken via a resistor network to the non-inverting input of error amp U1. The inverting input of U1 is driven by the DAC signal 32 that sets the desired APD current. U1 generates an error signal that is supplied to the feedback pin of U2 so as to adjust the APD current.

For small APD currents (e.g. up to about 55 uA) regulator U5 is inactive. Amplifier U4 acts as a non-inverting amplifier, with R11, R12, and R14 acting as a feedback network. The amplifier gain is such that a 55 uA APD current will produce about 2 volts at the input of U1. As the APD increases above the threshold (e.g. 55 uA in this example) sufficient voltage is developed across R12 to cause regulator U5 to conduct from anode to cathode. This effectively limits the voltage across U5, which reduces the closed-loop gain of U4, so that full-scale input (e.g. 5.0V) from the DAC 18 produces maximum bias current (e.g. around 500 uA) in the APD 2.

If the APD opens (i.e. fails) and will not accept current, the converter output voltage will increase as the circuit 36 tries to deliver the desired current. Field-effect transistor Q3 operates as a source follower and the voltage at the top end of R8 is close to the APD voltage. This is to limit the output voltage of the generator circuit 36 under unusual conditions, such as an open APD 2. With Q3 and R8 present, when the voltage to the opened APD 2 increases, the current through R8 increases and tries to shut down the generator 36 by driving the feedback pin of U2 positive.

A low voltage clamp circuit U6 with the resistor network R16, R17, and R18 provides a low voltage clamp to the APD 2. The clamp circuitry limits the positive swing at the left end of R2. In normal operation, the clamp circuitry is inactive and U1 controls the converter by forcing sufficient current through R2 to bring the VFB input of U2 above its threshold voltage. Current also flows into the VFB input via Q3 and R9, and a constant current of 83 uA flows to ground via R9, but U1 has sufficient available range that it remains in control. If the APD current tries to exceed the intended level, the voltage clamp will limit the current through R2 to about 50 uA depending on the adjustment of the potentiometer R17. The feedback path through Q3 and R8 must supply the missing 33 uA, and the circuit will settle at an APD voltage of about 22.5 volts, regardless of APD current. The clamp circuit is designed device independent, so that little adjustment of R17 is needed during calibration.

If desired, a clamp state indication circuit (not shown) can be added by comparing the voltage after U1 to a fixed voltage level to indicate whether the receiver is in low voltage clamp state. If desired, an APD bias voltage monitoring circuit can be added after the filter 40, which is used to filter out high frequency noise of the bias signal 26, to monitor the applied APD bias voltage and feed the monitored value to the microcontroller 14 through an ADC (not shown). If desired, the avalanche photodiode current magnitude can be monitored in a known manner and supplied to the microcontroller 14 via an ADC, again in a known manner.

The calibration of the APD receiver is designed into the circuit through adjusting the potentiometer R17 of the resistor network (R16, R17, and R18) surrounding the regulator U6 of the clamp circuit. The R17 is adjusted in the clamp circuit so that at an input power of about −15 dBm, the APD bias voltage is at a voltage corresponding to APD 2 gain factor of M=3. The clamp circuit is designed through the combination of R16, R17, and R18 to deliver an APD bias voltage at a low multiplication gain which provides the necessary voltage supply for any particular APD to operation even without any calibration mentioned above. As indicated above, the clamp is designed device (APD) independent, so that little adjustment is needed during calibration for the APD to operation. This approach does not need the pre-stored voltages corresponding to different multiplication factors and/or temperature characteristics of a particular APD to predict the bias setting point in operation.

Figure 5A:
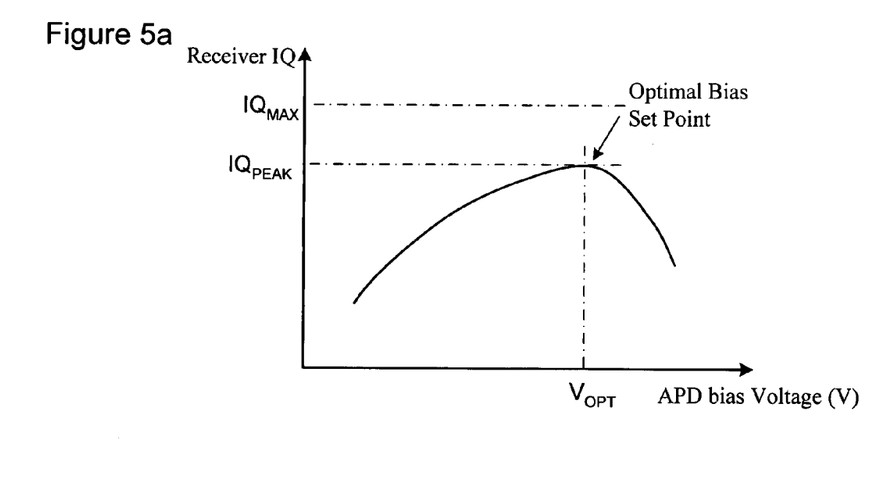
FIGS. 5a–5c are charts showing a relationship between APD bias voltage and the APD receiver eye quality, obtained using the present invention.
Figure 5B:
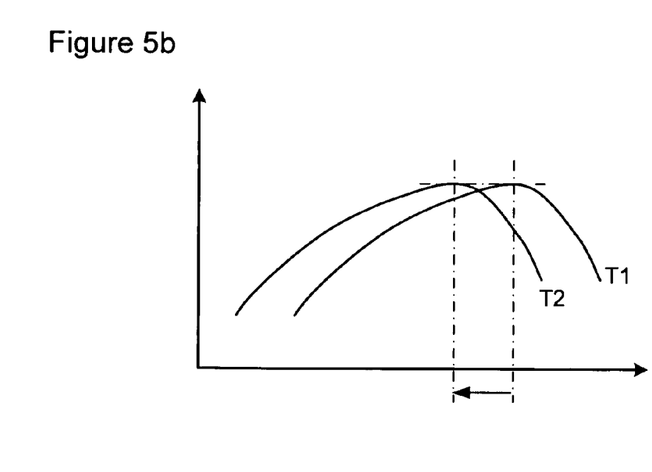
Figure 5C:
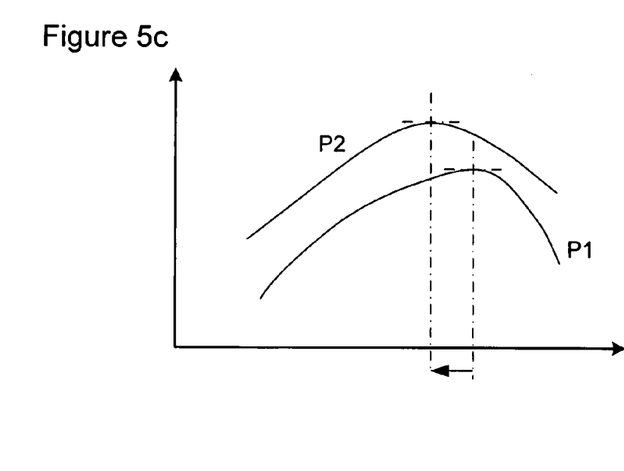

FIGS. 5a–c show a plots of the receiver eye quality IQ versus applied APD bias voltage. As may be seen in FIG. 5a, for a given input optical power level and APD temperature, the receiver IQ increases with increasing bias voltage to a peak value ($IQ_{PEAK}$), and then decreases as excess shot noise is generated with further increasing bias voltage. The optimum bias voltage ($V_{OPT}$) corresponds with the peak IQ value ($IQ_{PEAK}$), which represents the best possible receiver performance at any particular instant. This value will normally be somewhat lower than the maximum IQ value ($IQ_{MAX}$) that can be obtained by the receiver under optimum conditions.

As may be seen in FIGS. 5b and c, the optimum bias voltage ($V_{OPT}$) changes with variations in the APD temperature (FIG. 5b) and input optical power level (FIG. 5c). The optimum voltage will also exhibit a slow drift as receiver components age. In all cases, however, the optimum bias voltage corresponds with the peak IQ value ($IQ_{PEAK}$).

The APD bias control procedure implemented by the bias controller 30 operates by adjusting APD bias to hunt for an optimal IQ under the extant receiver operating conditions, such as temperature and optical power, but without the need to monitor these parameters. This is accomplished by dynamically adjusting APD bias voltage so that an optimum IQ is achieved through a blind search algorithm. As a result, the receiver can operate in a wide input optical power and wide operation temperature range. This approach also eliminates all of the conventional time consuming measurements of the APD characteristic data and calibration processes.

Figure 6:
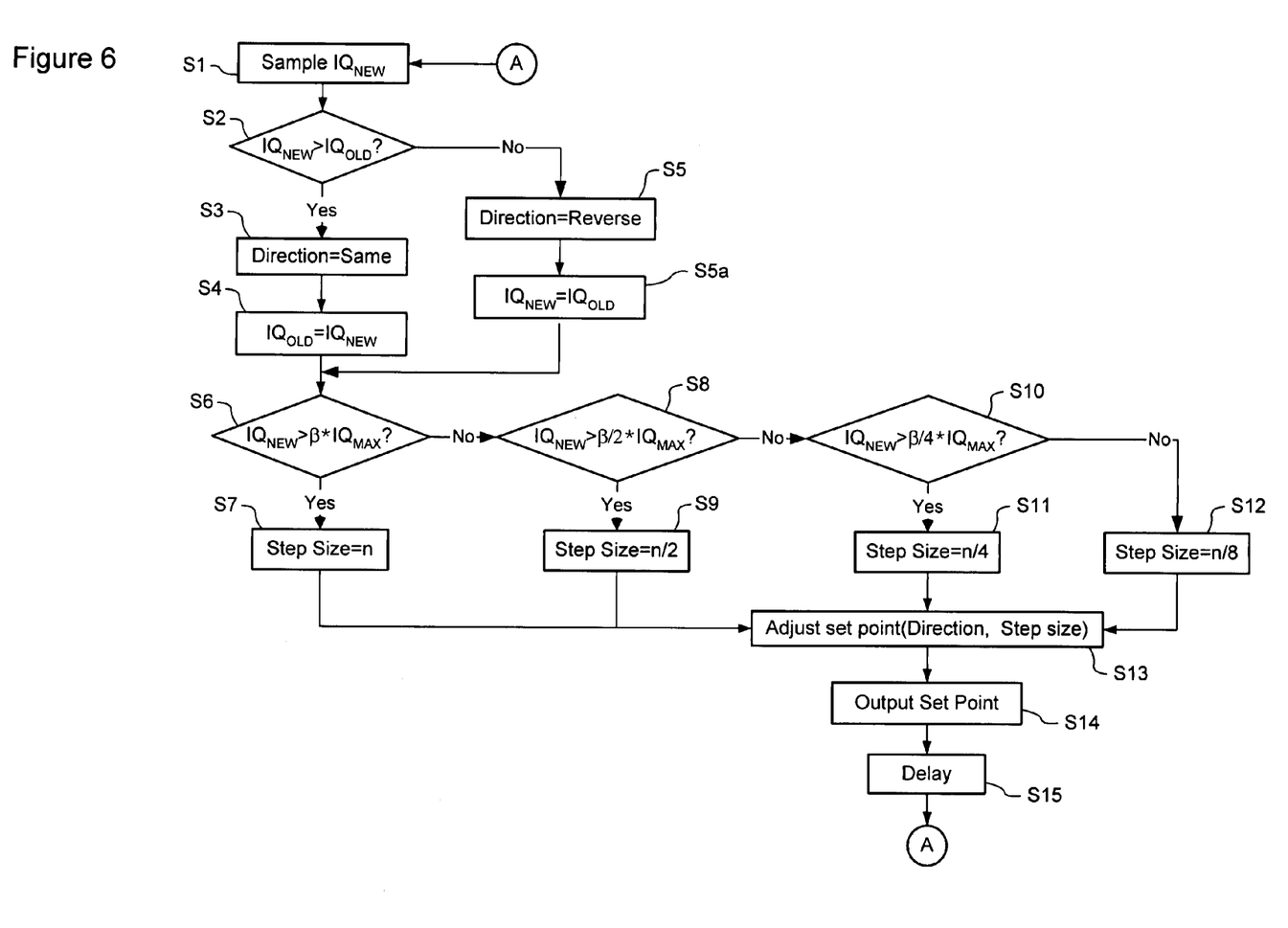
FIG. 6 is a flow-chart illustrating principle steps in an APD receiver bias control procedure in accordance with the present invention.

FIG. 6 is a flow chart illustrating principle steps in a control algorithm in accordance with an embodiment of the present invention. As may be seen in FIG. 6, the control algorithm comprises the following steps:

At a first step S1, the IQ value output from the CDR 10 (or detector 38) is sampled by the ADC 20 to obtain a new IQ value ($IQ_{NEW}$). If desired, the new IQ value ($IQ_{NEW}$) may be an average taken over a predetermined number of sample values.

A bias setting adjustment step size and direction is then calculated using the new IQ value ($IQ_{NEW}$) and the previous IQ value ($IQ_{OLD}$). The adjustment direction is decided by comparing the $IQ_{NEW}$ with $IQ_{OLD}$. If $IQ_{NEW}$ is larger than $IQ_{OLD}$ (step S2), the same direction is kept (at S3) and $IQ_{OLD}$ is updated with $IQ_{NEW}$ (at S4). Otherwise an opposite direction is chosen at step S5.

The step size is determined by comparing the IQ new with system maximum IQ value ($IQ_{MAX}$), so that sensitivity increases for smaller values of $IQ_{NEW}$. As will be appreciated, there are various ways of implementing such a scaling function. In the illustrated embodiment, a simple 4-step operation is used. Thus, if $IQ_{NEW}$ is larger than $\beta*IQ_{MAX}$ where 1>β>0, step S6, then the step size is set equal to n (step S7). If $IQ_{NEW}$ is less than $\beta*IQ_{MAX}$ but larger than $\beta/2*IQ_{MAX}$, step S8, then the step size is equal to n/2, step S9. If $IQ_{NEW}$ is less than $\beta/2*IQ_{MAX}$ but larger than $\beta/4*IQ_{MAX}$, step S10, then the step size is equal to n/4 step S11. Otherwise the step size is set equal to n/8 step S12. A variable step size is used to speed up the optimization process at large IQ corresponding to higher input power, and provide a stable optimization process at smaller IQ with higher resolution at low input power levels.

A new APD bias setting is then calculated at S13 using the step size and direction. The new bias setting can also be checked against known lower and upper limits of the DAC. If it is outside these limits, then the limit value will be used as the new bias setting.

The new APD bias setting is then output at step S14 to the APD bias generator circuit 36, via the DAC 18, to update the APD bias voltage/current 26. Processing then returns to step S1 above at which a new IQ value is sampled. However, a delay (S15) is inserted prior to sampling the new IQ value, in order to allow the CDR phase and decision reference levels to stabilize before a new IQ is estimated.

Figure 7:
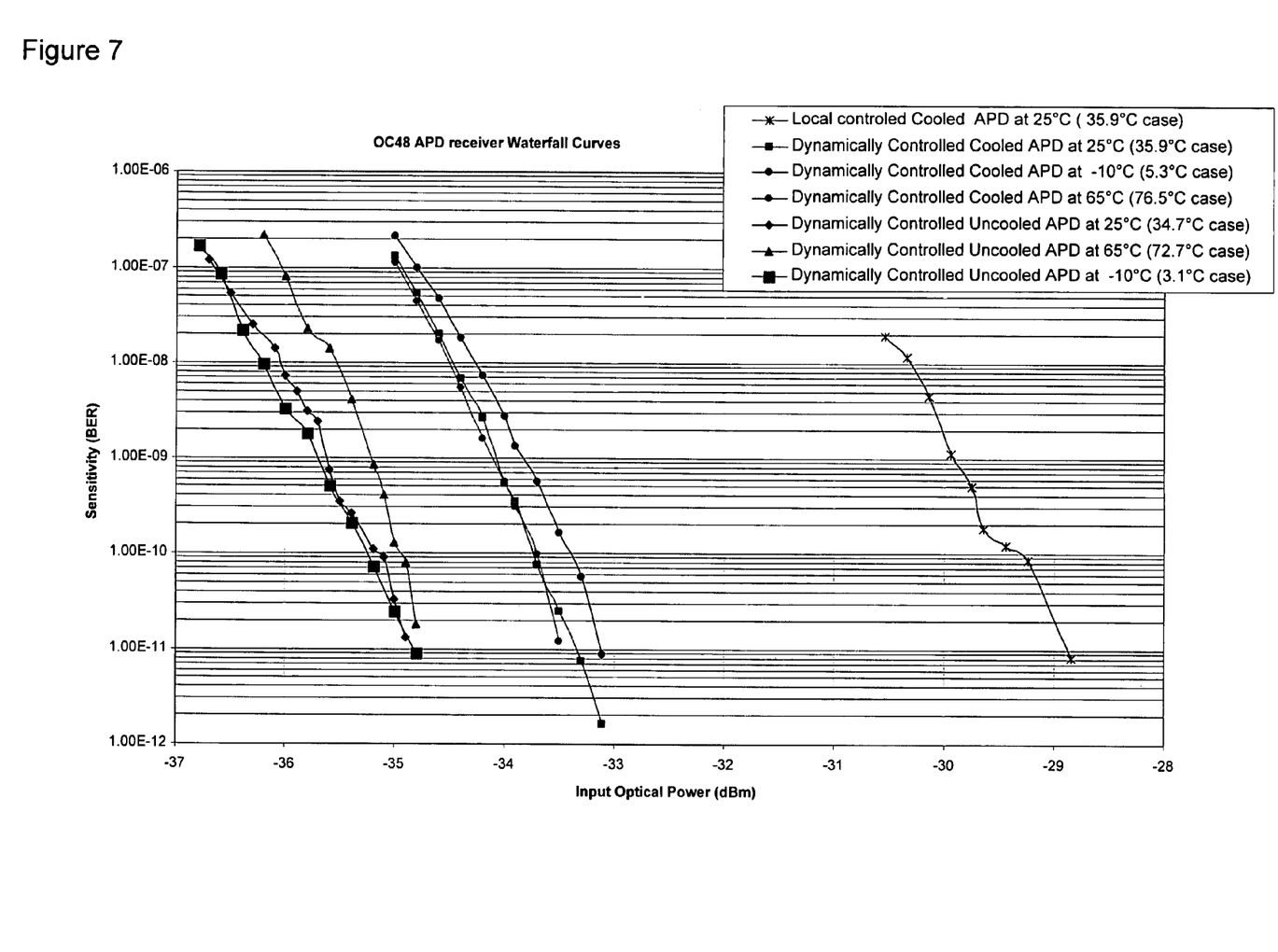
FIG. 7 is a chart showing a comparison between performance of a conventional APD receiver and a dynamic bias controlled APD receiver in accordance with the present invention for cooled and un-cooled operations.

FIG. 7 shows APD receiver sensitivity curves for uncooled and cooled APD receiver operation based on the dynamical optimization approach of the present invention, and for cooled APD receiver operation using the conventional local bias control approach. It is found that the dynamic optimization approach for uncooled APD operation provides about 6 dB better sensitivity than that for the local bias control approach for the cooled operation. It is also found that uncooled APD operation provides about 2.0 dB sensitivity improvement over the cooled APD operation based on the dynamically APD bias control approach. The improvement is because the TEC cooler inside the APD that generates both thermal and electrical noises, and mechanical stress created during the assembly of the heat sink and clamshell with the APD body that deteriorate the performance of the cooled APD operation. It is also found that uncooled APD operation based on this approach can operate over a wide temperature range with Very good receiver sensitivity.

The embodiment(s) of the invention described above is (are) intended to be exemplary only. The scope of the invention is therefore intended to be limited solely by the scope of the appended claims.

I claim:

1. A method of dynamically controlling a bias point of a photodiode of an optical receiver, the method comprising iteratively repeating steps of:
    detecting a performance parameter indicative of an eye opening of an optical signal received by the optical receiver;
    comparing a current value to a previous value of the performance parameter;
    calculating an adjustment step size and direction based on the comparison result;
    calculating an updated bias setting value based on a current value of the bias setting and the calculated adjustment step size and direction; and
    generating the bias voltage based on the updated bias setting value.

2. A method as claimed in claim 1, wherein the performance parameter comprises any one of:
    an eye opening ratio;
    an Optical signal to Noise ratio (OSNR);
    an eye quality (IQ); and
    a bit error rate.

3. A method as claimed in claim 1, wherein the step of calculating an adjustment step direction comprises a step of reversing the step direction if the current value of the performance parameter is less than the previous value.

4. A method as claimed in claim 1, wherein the step of calculating an adjustment step size comprises a step of scaling the step size with a relative magnitude of the current value of the performance parameter.

5. A controller for dynamically optimizing a bias point of a photodiode of an optical receiver, the controller comprising:
    detector means for detecting a performance parameter indicative of an eye opening of an optical signal received by the optical receiver; and
    a processor for calculating a bias point that optimizes a value of the detected performance parameter, the processor operating under control of software code adapted to:
        compare a current value of the performance parameter to a previous value;
        calculate an adjustment step size and direction based on the comparison result; and
        calculate the bias point based on the calculated adjustment step size and direction.

6. A controller as claimed in claim 5, wherein the performance parameter comprises any one of:
    an eye opening ratio;
    an Optical signal to Noise ratio (OSNR);
    an eye quality (IQ); and
    a bit error rate.

7. A controller as claimed in claim 6, wherein the detector means comprises a clock and recovery (CDR) circuit of the receiver.

8. A controller as claimed in claim 6, wherein the detector means comprises a detector circuit associated with a clock and data recovery (CDR) circuit of the receiver.

9. A controller as claimed in claim 5, wherein the processor further operates under control of software code adapted to:
    calculate an updated bias setting value based on a current value of the bias setting and the calculated adjustment step size and direction.

10. An optical receiver for receiving an optical communications signal, the receiver comprising:
    a photodiode for converting the optical communications signal into a corresponding electrical signal;
    detector means responsive to the electrical signal for detecting a performance parameter indicative of an eye opening of the optical signal;
    a processor for calculating a bias point of the photodiode that optimizes a value of the detected performance parameter, the processor operating under control of software code adapted to:
        compare a current value of the performance parameter to a previous value;
        calculate an adjustment step size and direction based on the comparison result; and
        calculate the bias point based on the calculated adjustment step size and direction; and
    a bias generator for supplying a bias signal to the photodiode based on the calculated bias point.

11. A receiver as claimed in claim 10, wherein the performance parameter comprises any one of:
    an eye opening ratio;
    an Optical signal to Noise ratio (OSNR);
    an eye quality (IQ); and
    a bit error rate.

12. A receiver as claimed in claim 11, wherein the detector means comprises a clock and data recovery (CDR) circuit of the receiver.

13. A receiver as claimed in claim 11, wherein the detector means comprises a detector circuit associated with a clock and data recovery (CDR) circuit of the receiver.

14. A receiver as claimed in claim 10, wherein the processor further operates under control of software code adapted to:
    calculate an updated bias setting value based on a current value of the bias setting and the calculated adjustment step size and direction.

* * * * *

UNITED STATES PATENT AND TRADEMARK OFFICE
CERTIFICATE OF CORRECTION

PATENT NO. : 7,103,288 B2 Page 1 of 1
APPLICATION NO. : 10/801711
DATED : September 5, 2006
INVENTOR(S) : Wenlu Wang It is certified that error appears in the above-identified patent and that said Letters Patent is hereby corrected as shown below:

Column 8, line 10, "recovery" should read --data recovery--.

Signed and Sealed this

Thirtieth Day of January, 2007

JON W. DUDAS
*Director of the United States Patent and Trademark Office*